US007339616B2

(12) United States Patent
Mabuchi et al.

(10) Patent No.: US 7,339,616 B2
(45) Date of Patent: Mar. 4, 2008

(54) SOLID-STATE IMAGE PICKUP DEVICE AND IMAGE INPUT DEVICE

(75) Inventors: Keiji Mabuchi, Kanagawa (JP); Takahisa Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 623 days.

(21) Appl. No.: 10/041,252

(22) Filed: Jan. 8, 2002

(65) Prior Publication Data

US 2002/0100921 A1 Aug. 1, 2002

(30) Foreign Application Priority Data

Jan. 9, 2001 (JP) ............................. 2001-001685

(51) Int. Cl.
*H04N 5/225* (2006.01)
(52) U.S. Cl. ..................... 348/220.1; 348/294
(58) Field of Classification Search ............. 348/220.1, 348/302, 222.1, 241, 243, 246, 294; 250/208.1
See application file for complete search history.

(56) References Cited

U.S. PATENT DOCUMENTS

| | | | | |
|---|---|---|---|---|
| 6,130,420 A * | 10/2000 | Tanaka et al. | ........... | 250/208.1 |
| 6,292,218 B1 * | 9/2001 | Parulski et al. | .......... | 348/220.1 |
| 6,686,957 B1 * | 2/2004 | Johnson et al. | .......... | 348/222.1 |
| 6,829,008 B1 * | 12/2004 | Kondo et al. | ................ | 348/302 |
| 6,831,690 B1 * | 12/2004 | John et al. | ................... | 348/302 |
| 2002/0050518 A1 * | 5/2002 | Roustaei | ..................... | 235/454 |

FOREIGN PATENT DOCUMENTS

JP 2001-257946 9/2001

OTHER PUBLICATIONS

Japanese Office Action Issued on Dec. 5, 2006.

* cited by examiner

*Primary Examiner*—Lin Ye
*Assistant Examiner*—Yogesh Aggarwal
(74) *Attorney, Agent, or Firm*—Sonnenschein Nath & Rosenthal LLP

(57) ABSTRACT

A solid-state image pickup device including a sensor portion 22 having plural pixels arranged, a vertical scan portion 23 and a horizontal scan portion 24 for scanning the pixels of the sensor portion 22, an output portion 26 to which signals output from the sensor portion 22 are supplied, a bias current adjusting portion 30 for making the bias current of the output portion 26 variable, a driving signal generator 27 for supplying driving signals to the vertical scan portion 23, the horizontal scan portion 24 and said output portion 26, and an input portion 28 for supplying plural driving mode signals to the driving signal generator 27, wherein the driving frequency is made variable by the plural driving mode signals, and the bias current adjusting portion 30 is supplied with a signal for making the bias current variable in accordance with the plural driving mode signals.

13 Claims, 9 Drawing Sheets

ALL PIXEL READING MODE

1/9 THIN-OUT READING MODE

1/4 THIN-OUT READING MODE

CUT-OUT READING MODE

EXAMPLE 1 OF BIAS CURRENT ADJUSTING CIRCUIT

EXAMPLE 2 OF BIAS CURRENT ADJUSTING CIRCUIT

SOLID-STATE IMAGE PICKUP DEVICE AND IMAGE INPUT DEVICE

RELATED APPLICATION DATA

The present application claims priority to Japanese Application(s) No(s). P2001-001685 filed Jan. 9, 2001, which application(s) is/are incorporated herein by reference to the extent permitted by law.

BACKGROUND OF THE INVENTION

1. Field of the Invention

The present invention relates to a solid-state image pickup device applied to an image input system or the like, and particularly to an MOS type solid-state image pickup device. Further, the present invention relates to an image input device having an MOS type solid-state image pickup device mounted therein.

2. Description of the Related Art

Recently, a digital camera, a PC camera, an optical mouse, a portable TV telephone, etc. have been developed as an image input system using a solid-state image pickup device. These devices have been required to be low in driving voltage and power consumption not only from the image quality, but also from the viewpoint of battery using time and compact-size. CCD sensors have difficulties to satisfy these requirements, and thus MOS-type solid-state image pickup devices have been more frequently used. The MOS type solid-state image pickup device has advantages that it is driven with a single power source, has low power consumption and is designed in a system-on-chip form, and also it has a large degree of freedom for read-out. For example, only a part of an image can be output (cut-out operation), and information of an image can be output skip by skip (thin-out operation).

FIG. 9 shows the overall construction of a conventional MOS type solid-state image pickup device.

An MOS type solid-state image pickup device 1 comprises a sensor portion 2 having many unit pixels arranged in a matrix form, each unit pixel comprising a photodiode for performing photoelectric conversion and an MOS switch, a vertical scan circuit 3 and a horizontal scan circuit 4 for driving the sensor portion 2, a CDS (correlated double sampling)/signal holding circuit 5 for receiving signals of pixels of one line of the sensor portion 2, an output amplifier 6, a timing generating circuit 7 for generating pulses to operate the vertical scan circuit 3, the horizontal scan circuit 4, the CDS/signal holding circuit 5 and the output amplifier 6, and a serial interface 8.

In the sensor portion 2, each of vertical selecting lines 10 from the vertical scan circuit 3 is commonly connected to the pixels of each line to supply vertical scan pulses $\phi V$ [$\phi V_1$, $\phi V_2$, ... $\phi V_n$] from the vertical scan circuit 3 to the pixels of the respective lines through the vertical selection lines 10 at the same time. Further, each of vertical signal lines is commonly connected to the pixels of each column, and each vertical signal line 11 is connected to a horizontal signal line 12 through the CDS/signal holding circuit 5. The horizontal signal line 12 is connected to the input side of the output amplifier 6. The horizontal scan circuit 4 supplies the horizontal switches of the CDS/signal holding circuit 5 with horizontal scan pulses $\phi H$ [$\phi H_1$, $\phi H_2$, ..., $\phi H_n$] to select a pixel signal from the CDS/signal circuit 5 and output it to the horizontal signal line 12.

The serial interface 8 is supplied with serial data from the external. Further, a synchronous signal and a clock signal from the external are supplied to the serial interface 8 and the timing generating circuit 7.

In this CMOS type solid-state image pickup device 1, the serial interface 8 receives data from the external, and the operation of the timing generating circuit 7 is controlled in accordance with the data. In the timing generating circuit 7, driving pulses for driving the vertical scan circuit 3, the horizontal scan circuit 4, the CDS/signal holding circuit 5 and the output amplifier 6 in accordance with the data are generated and output to the respective parts. In the sensor portion 2, the scan operation is carried out by the vertical scan circuit 3, that is, the pixel lines are successively selected by the vertical selection pulses $\phi V$ [$\phi V_1$, $\phi V_2$, ... $\phi V_n$] from the vertical scan circuit 3 and the signals of the pixels of each line thus selected (scanned) are output through the corresponding vertical signal line 11 to the CDS/signal holding circuit 5.

The CDS/signal holding circuit receives signals of one line, and holds signals achieved by subtracting offset components (corresponding to a fixed pattern noise component) inherent to the respective pixels from the signals of the line concerned. The horizontal switches are successively switched on by the horizontal scan pulses $\phi H$ [$\phi H_1$, $\phi H_2$, ..., $\phi H_n$] from the horizontal scan circuit 4, and the signals of the pixels of one line held in the CDS/signal holding circuit 5 are successively read out through the horizontal signal line 12 to the output amplifier 6. The output amplifier 6 amplifies these signals and outputs them to an output terminal $t_{out}$ as analog signals.

The power consumption of the MOS type solid-state image pickup device 1 as described above is equal to about one fifth of that of a CCD solid-state image pickup device, however, the power consumption thereof is required to be further reduced when it is installed in portable equipment. Further, as the number of pixels increases and the output rate (that is, the driving frequency of the horizontal scan circuit) increases, the power consumption is also increased.

Considering the power consumption of the MOS type solid-state image pickup device, it has power consumption equal to or less than 1/10 of that of CCD pixels in a pixel portion, and this value is almost negligible. Further, the power consumption is also relatively small in digital portions (the serial interface 8, the timing generating circuit 7, the vertical scan circuit 3, the horizontal scan circuit 4, etc.), and the output amplifier 6 of the analog circuit has the highest power consumption. Particularly, as the number of pixels increases, the driving frequency increases, so that the frequency characteristic of the output amplifier 6 (hereinafter referred to as "f-characteristic") must be increased. The increase of the f-characteristic in the analog circuit causes bias current to be increased, and thus the power consumption is more and more increased.

Further, as the number of pixels increases and thus the output rate is also increased, random noises of the output circuit are intensified.

Besides, as the overall power consumption is increased, the image pickup chip is heated to induce thermal current, and the thermal current thus induced enters the photodiodes of the sensor portion, resulting in increase of noise current (so-called dark current). Accordingly, the noise current is increased only around the output amplifier.

SUMMARY OF THE INVENTION

The present invention has been implemented in view of the foregoing points, and has an object to provide a solid-state image pickup device and an image input device which can promote reduction in power consumption and reduction of random noises.

In order to attain the above object, according to an aspect of the present invention, there is provided a solid-state image pickup device comprising: a sensor portion having plural pixels arranged; a vertical scan portion and a horizontal scan portion for scanning the pixels of the sensor portion; an output portion to which signals output from the sensor portion are supplied; a bias current adjusting portion for making the bias current of the output portion variable; a driving signal generator for supplying driving signals to the vertical scan portion, the horizontal scan portion and the output portion; and an input portion for supplying plural driving mode signals to the driving signal generator, wherein the driving frequency is made variable by the plural driving mode signals, and the bias current adjusting portion is supplied with a signal for making the bias current variable in accordance with the plural mode signals.

An image input device according to the present invention has the above solid-state image pickup device.

According to the solid-state image pickup device of the present invention, in accordance with the driving mode of the sensor portion, for example, in a driving mode such as a thin-out mode, a cut-out mode, a low-speed operating mode or the like, the driving frequency is varied to a lower side by a driving mode signal, and the bias current of the analog circuit of the output portion is switched in accordance with the variation of the driving frequency by the bias current adjusting portion, so that the frequency characteristic of the analog circuit of the output portion is switched to a lower side, thereby reducing the power consumption in the solid-state image pickup device. Further, the random noises in the driving mode in which the driving frequency is lowered are reduced.

In the image input device of the present invention, by equipping the solid-state image pickup device as described above, the power consumption can be reduced, and the random noises in the driving mode in which the driving frequency is lowered can be reduced.

DETAILED DESCRIPTION OF THE PREFERRED EMBODIMENTS

Preferred embodiments according to the present invention will be described hereunder with reference to the accompanying drawings.

Figure 1:
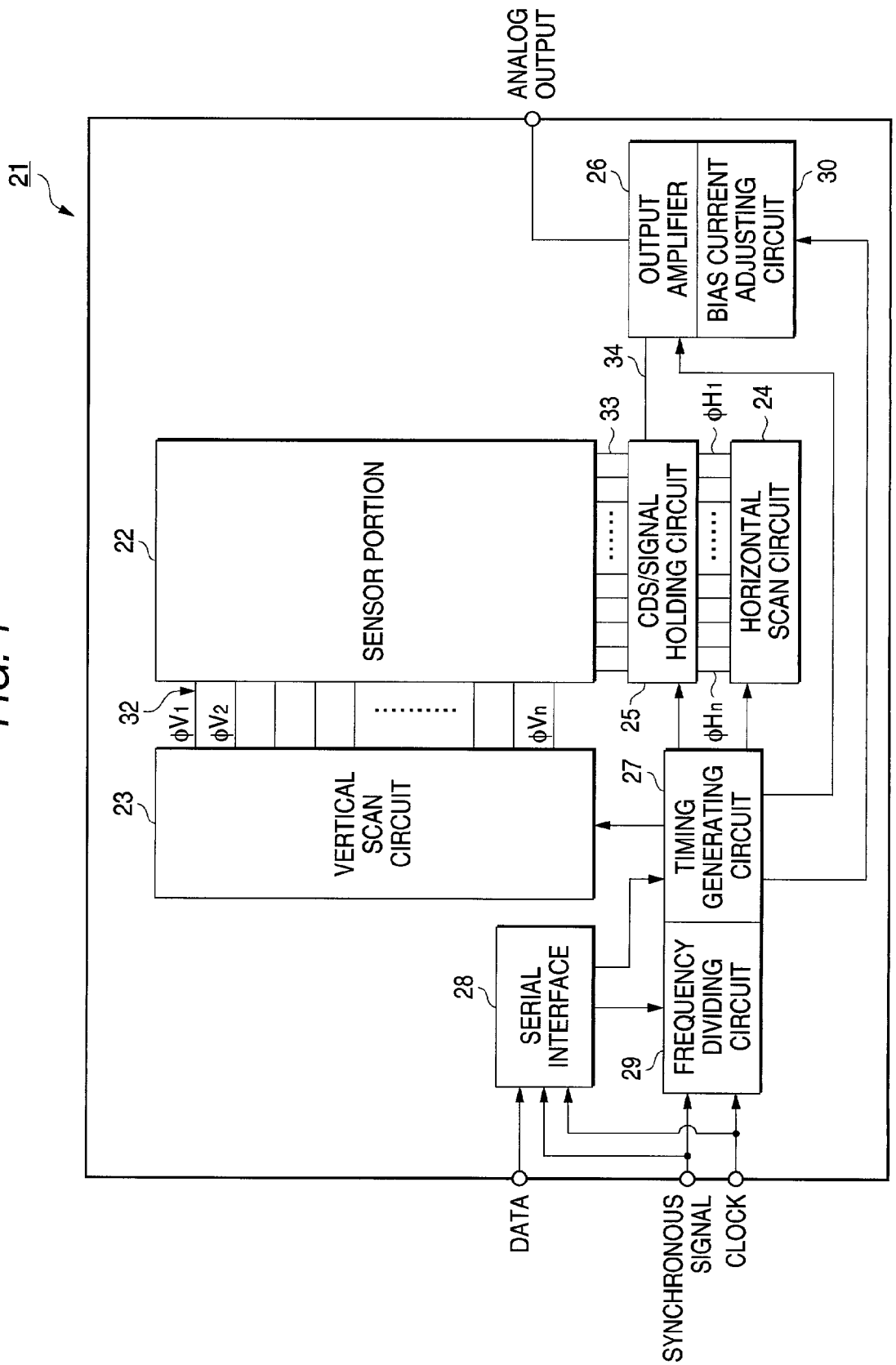
FIG. 1 is a diagram showing a first embodiment of a solid-state image pickup device according to the present invention.

FIG. 1 shows a solid-state image pickup device of the present invention, that is, shows the construction of a first embodiment of an MOS type solid-state image pickup device according to the present invention.

An MOS type solid-state image pickup device 21 includes a sensor portion 22 having many unit pixels arranged in a matrix form, each unit pixel comprising a photodiode for performing photoelectric conversion and an MOS switch element, a vertical scan circuit 23 and a horizontal scan circuit 24 for driving the sensor portion 22, a CDS/signal holding circuit 25 for receiving signals of pixels of one line of the sensor potion 22, an output amplifier 26, a timing generating circuit 27 for generating pulses for driving the respective parts, and a serial interface 28, and also includes a frequency dividing circuit 29 for frequency-dividing a clock signal in accordance with an instruction from the serial interface 28, and means for adjusting the f-characteristic of the output amplifier 26 (in this embodiment, a bias current adjusting circuit 30 for adjusting bias current to the output amplifier 26).

In the sensor portion 22, each of vertical selecting lines 32 from the vertical scan circuit 23 is commonly connected to the pixels of each line to supply vertical scan pulses $\phi V$ [$\phi V_1, \phi V_2, \ldots \phi V_n$] from the vertical scan circuit 23 to the pixels of the respective lines through the vertical selection lines 32 at the same time. Further, each of vertical signal lines 33 is commonly connected to the pixels of each column, and each vertical signal line 33 is connected to a horizontal signal line 34 through the CDS/signal holding circuit 25. The horizontal signal line 34 is connected to the input side of the output amplifier 26. The CDS/signal holding circuit 25 is provided with horizontal switch elements in connection with the respective pixel columns, and horizontal scan pulses $\phi H$ [$\phi H_1, \phi H_2, \ldots, \phi H_n$] from the horizontal scan circuit 24 are supplied to the horizontal switch elements.

Serial data are input from the external to the serial interface 28. The serial data are data to specify a driving mode for the sensor portion 22 as described later. A synchronous signal and a clock signal are input from the external to the serial interface 28 and the frequency-dividing circuit 29, respectively.

The timing generating circuit 27 is designed to generate timing pulses of plural driving modes in connection with plural driving modes. The timing generating circuit 27 supplies each of the vertical scan circuit 23, the horizontal scan circuit 24, the CDS/signal holding circuit 25, the output amplifier 26 and the bias current adjusting circuit 30 with desired pulses for driving the respective elements. The frequency-dividing circuit 29 frequency-divides the clock signal in accordance with an instruction from the serial interface 28, and inputs it to the timing generating circuit 27. The instruction of the serial interface 27 is input to the frequency-dividing circuit 29 and the timing generating circuit 27. Next, the operation of the MOS type solid-state image pickup device 21 according to this embodiment will be described.

The serial data corresponding to the driving mode of the sensor portion 22 are input to the serial interface 28, and mode selection is carried out. The data corresponding to the driving mode are decoded by the serial interface 28, and input to the frequency-dividing circuit 29 and the timing generating circuit 27. In the frequency-dividing circuit 29, for example, the clock signal input from the external is frequency-divided in accordance with an instruction (an instruction based on the selected driving mode) from the serial interface 28, and the clock signal thus frequency-divided is synchronized with the synchronous signal and then input to the timing generating circuit 27.

The timing generating circuit 27 receives the clock signal from the frequency-dividing circuit 29 and the data from the serial interface 28 to generate the timing pulse of the selected driving mode, and inputs the timing pulse thus generated to each of the vertical scan circuit 23, the horizontal scan circuit 24, the CDS/signal holding circuit 25, the output amplifier 26 and the bias current adjusting circuit 30.

The sensor portion 22 is driven by the vertical scan circuit 23, that is, the pixels of a line are selected by the vertical selection pulse φV from the vertical scan circuit 23 in accordance with the driving mode and the signals of the pixels of the selected line are output through the vertical signal lines 33 to the CDS/signal holding circuit 25. The CDS/signal holding circuit 25 receives the signals of one line and holds the signals achieved by subtracting an offset component inherent to each pixel (corresponding to a fixed pattern noise component) from the signals received.

The horizontal switch elements are successively switched on by the selected horizontal scan pulse φH from the horizontal scan circuit 24, and the signals of the pixels of one line which are held in the CDS/signal holding circuit 25 are read out through the horizontal signal line 34 to the output amplifier 26.

The bias current adjusting circuit 30 is controlled by the timing pulse from the timing generating circuit to adjust the bias current of the output amplifier 26. The f-characteristic of the output amplifier 26 is adjusted by the bias current. The output amplifier 26 amplifies the signals of the pixels from the CDS/signal holding circuit 25, and outputs the signals thus amplified from the output terminal $t_{out}$ as analog signals.

The driving mode of the sensor portion, a so-called reading mode contains the following modes.

Figure 3:
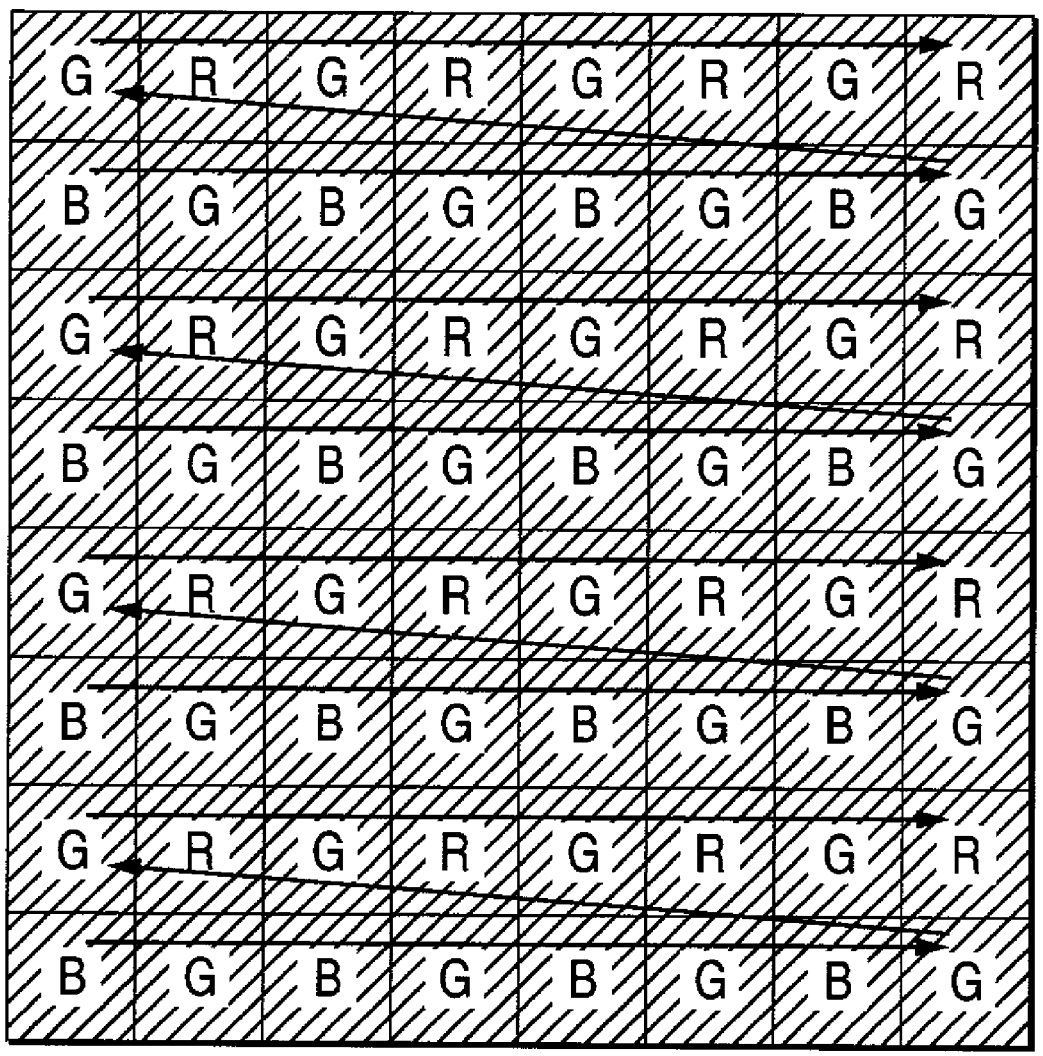
FIG. 3 is a diagram showing a full-pixel reading mode.

(1) Full-pixel reading mode: all the pixels are selected and read out in turn (see FIG. 3).

FIG. 3 shows an arrangement of 8×8 pixels for simplification. However, actually, many pixels are arranged and hatched pixels are read out. R represents pixels having red color filters, G represents pixels having green color filters and B represents pixels having blue color filters (and so forth).

Figure 4:
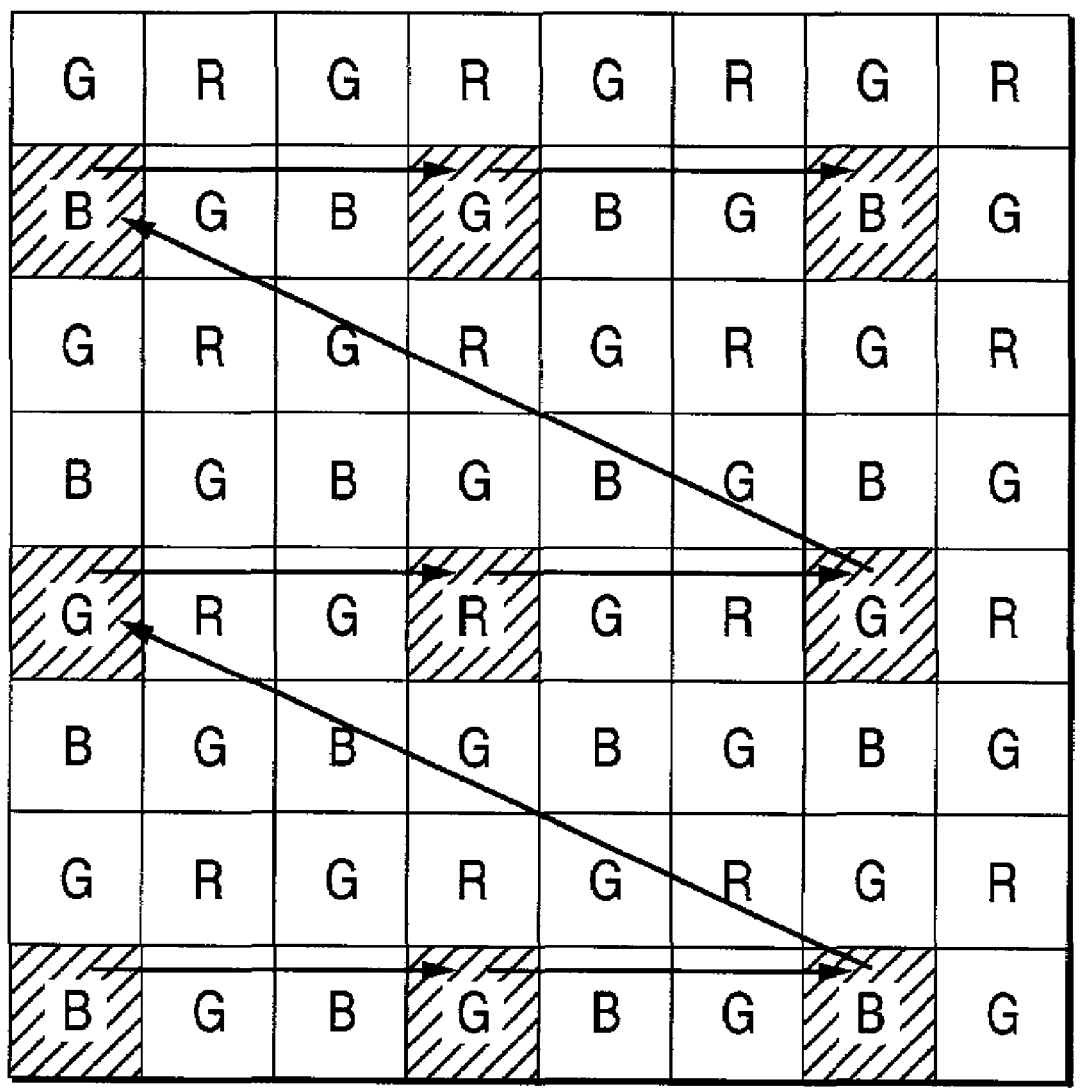
FIG. 4 is a diagram showing a ⅛-thin-out reading mode.
Figure 5:
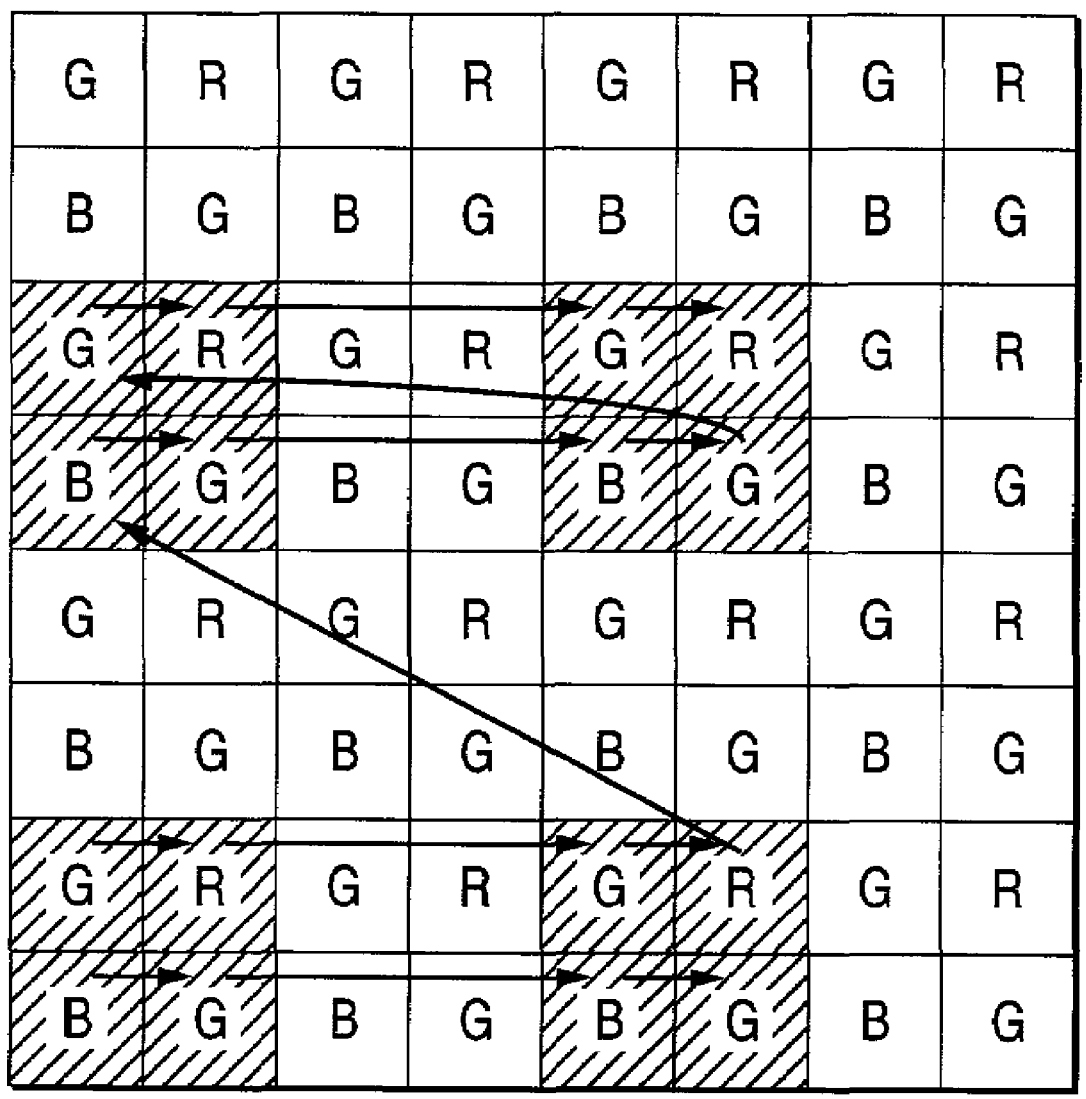
FIG. 5 is a diagram showing a ¼-thin-out reading mode.

(2) Thin-out reading mode: only thin-out pixels are read out (see FIGS. 4, 5). FIG. 4 shows a ⅛ thin-out reading mode, and FIG. 5 shows a ¼ thin-out reading mode. In the following cases, it is effective to thin out output signals of the solid-state image pickup device to reduce the number of the output signals.

(a) For example, in a digital camera, high definition is required to an image to be picked up by releasing a shutter. However, at the stage that a subject is viewed through a small liquid crystal screen before picking up an image thereof, it is sufficient to display a rough image which is matched with the number of pixels of the liquid crystal display. Therefore, the signals of the image are thinned out.

(b) In image transmission using a portable TV telephone, the data rate of the transmission is restricted. Therefore, a still image is transmitted with high definition, however, moving pictures are transmitted while the signals thereof are thinned out to reduce the information amount.

Figure 6:
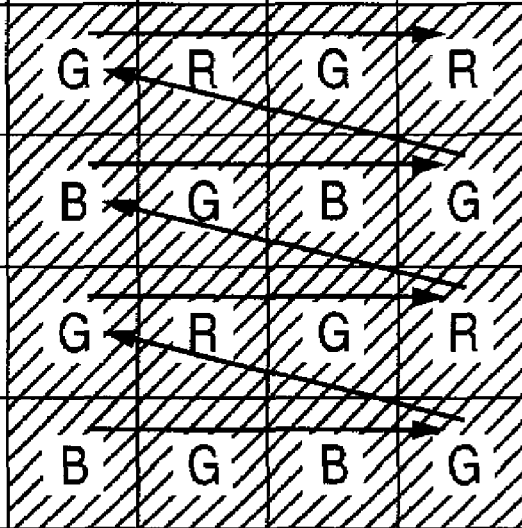
FIG. 6 is a diagram showing a cut-out reading mode.

(3) Cut-out reading mode: only the pixels of a partial section are cut out and the signals thereof are read out (see FIG. 6). In the following cases, it is effective to cut out the output signals of the solid-state image pickup device to read out them.

(a) When only information around the center of the screen is required for auto focusing, auto iris.

(b) When only a part of the screen is viewed while enlarged.

(4) Low-speed operating mode: mode in which frame rate is reduced.

In the following cases, it is effective to read out output signals while reducing the frame rate.

(a) In the case of a monitoring camera, etc. for which the frame rate may be reduced.

(b) In the case of battery operating equipment, etc. for which low power consumption or long-term scan operation takes priority.

Here, in the modes of (2), (3), in order to set the brightness to that of the full-pixel reading mode and prevent a viewer from having sense of discomfort when the mode is changed from the full-pixel reading mode, the frame rate at default value is set to the same value as (1). In this case, the driving frequency of the solid-state image pickup device is reduced, and thus it is driven at the frequency matched with the reduction by the frequency-dividing circuit 29. In the mode (4), since the driving frequency is reduced even in the full-pixel reading mode, and thus it is driven at the frequency matched with the reduction by the frequency-dividing circuit 29. The brightness is adjusted by an electronic shutter.

This embodiment is characterized by the existence of the frequency-dividing circuit 29 for switching the frequency to be divided in accordance with the signal from the serial interface 28, the existence of the bias current adjusting circuit 30 for the output amplifier 26 and the adjustment of the f-characteristic of the output amplifier 26 under the control of the timing generating circuit 27. The power consumption and the fixed rate of random noises of the MOS type solid-state image pickup device are contributed by the output amplifier 26. By adjusting the f-characteristic optimally in accordance with the driving mode, the power consumption can be reduced and the image quality can be enhanced.

For example, in the case of an MOS type solid-state image pickup device of VGA (640×480) installed on the portable terminal, moving pictures of the monitoring are displayed on a small liquid crystal screen and thus 30 images per second are output in the ¼ thin-out mode. When a still picture is output, the driving mode is changed to the full-pixel reading mode if a shutter is detected, and the rate (frequency) of the internal clock output from the frequency-dividing circuit 29 is increased to output the signals of all the pixels. Thereafter, the rate (frequency) of the internal clock is reduced and the driving mode is returned to the ¼ thin-out mode.

The power consumption reducing effect is as follows.

In the full-pixel reading mode, the internal clock is equal to 12.27 MHz, and in the ¼ thin-out reading mode, the internal clock is equal to 3.07 MHz. The bias current of the output amplifier 26 is totally equal to 5 mA in the full-pixel reading mode. However it is equal to 1.5 mA in the ¼ thin-out mode. The power source voltage is equal to 2.8V, and the total power consumption of the output amplifier 26 is equal to 16.0 mW in the full-pixel reading mode and 5.0 mW in the ¼ thin-out mode. The total power consumption of the solid-state image pickup device is equal to 34 mW in the full-pixel reading mode and 11.2 mW in the ¼ thin-out mode, so that the power consumption can be reduced to about ⅓. Normally, the operation of 99% or more is the monitoring operation, and the power consumption can be actually reduced to ⅓ by installing the frequency-dividing circuit 29 and the bias current adjusting circuit 30.

With respect to the enhancement of the image quality, the random noise can be reduced in a low-speed operation mode like (2), (3), (4). According to this embodiment, in the case of the low-speed operation, the f-characteristic of the output amplifier 26 is reduced and thus the noise band is narrowed. For example, if the f-characteristic is reduced to ¼, the random noise occurring in the output amplifier 26 could be reduced to ½, and if the f-characteristic is reduced to ⅑, the random noise could be reduced to ⅓. This is very effective to enhance the image quality. In the case of the MOS type solid-state image pickup device of VGA described above, the random noise in the full-pixel reading mode in which 30 images are output per second is equal to 1.45 mV. On the other hand, in the ¼ thin-out mode, the random noise is equal to 0.75 mV, and in the full-pixel low-speed reading mode in which 7.5 images are output per second, the random noise is equal to 0.75 mV, which exhibits a remarkable effect.

Figure 7:
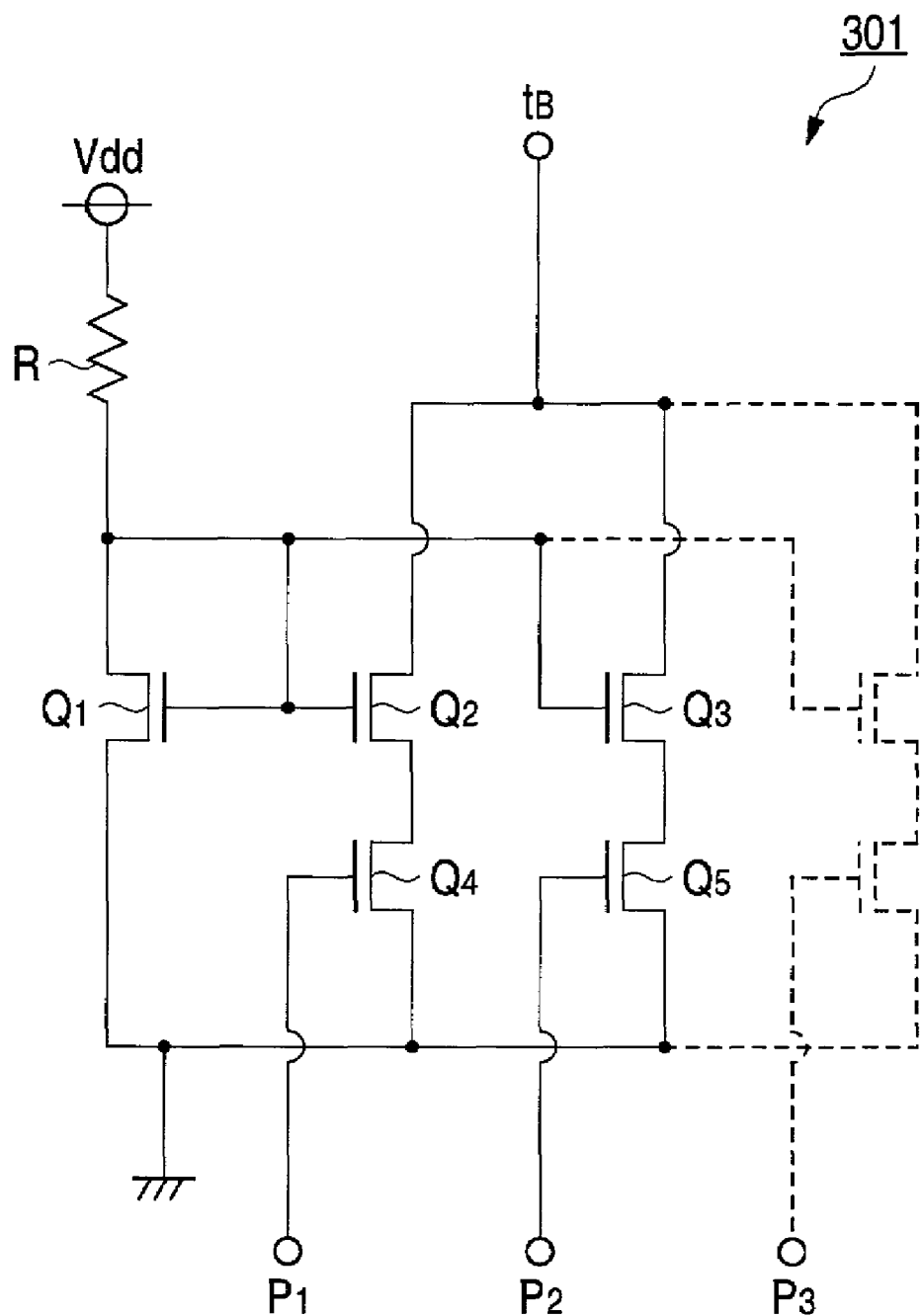
FIG. 7 is a circuit diagram showing an example of a bias current adjusting circuit applied to the present invention.
Figure 8:
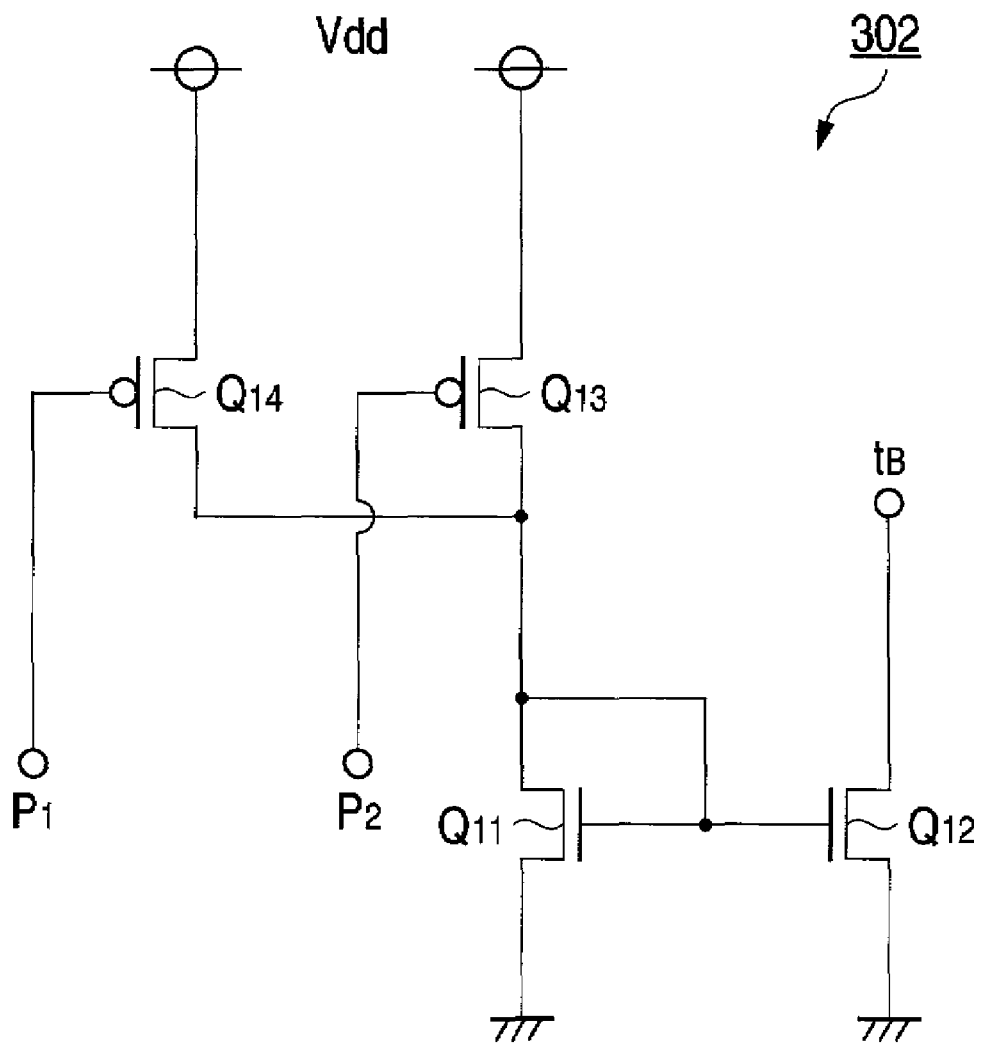
FIG. 8 is a circuit diagram showing another example of the bias current adjusting circuit applied to the present invention.
Figure 9:
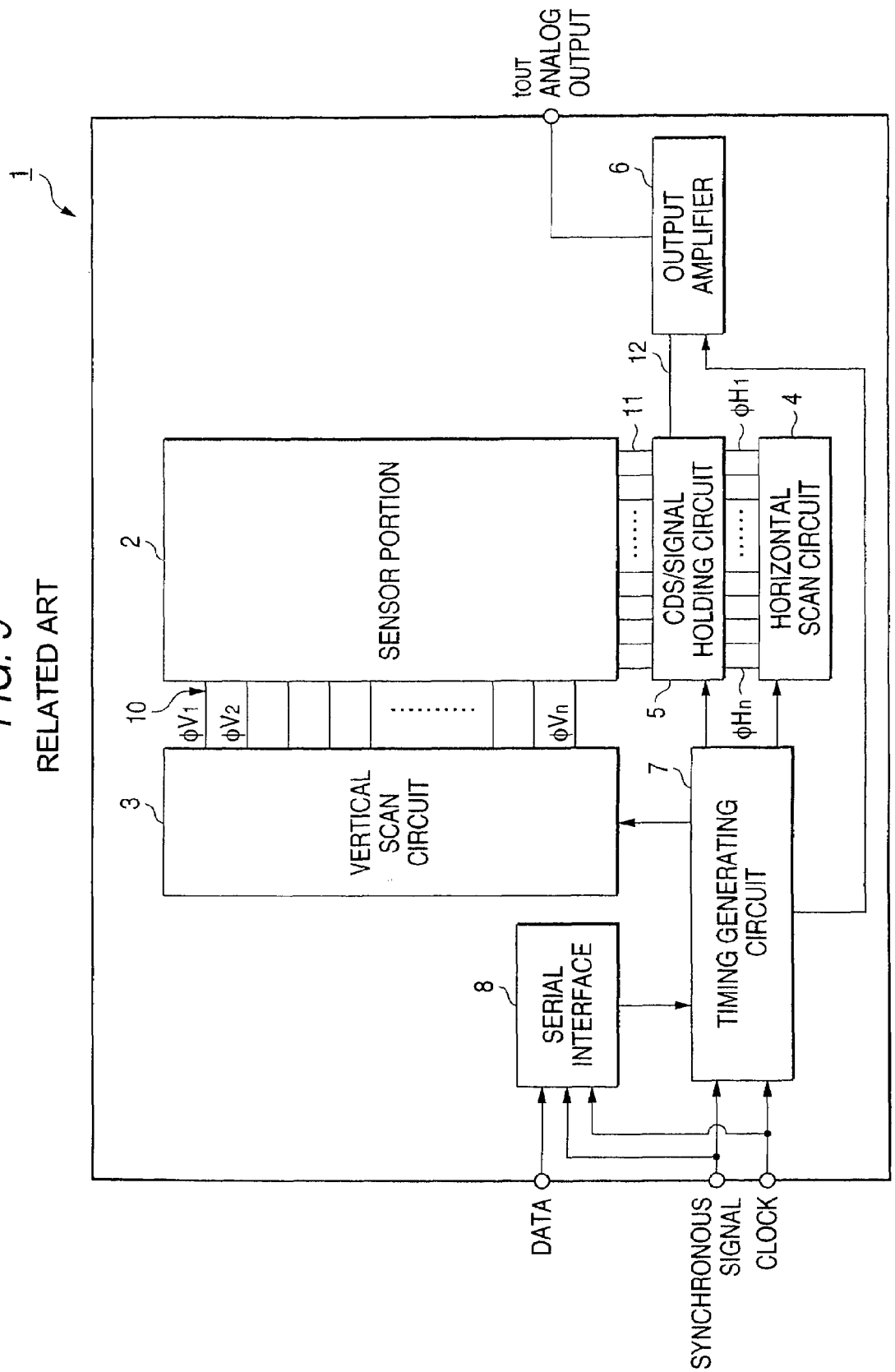
FIG. 9 is a diagram showing a conventional solid-state image pickup device.

A well-known amplifier may be used as the output amplifier 26 irrespective of the circuit form. FIGS. 7 and 8 show examples of the bias current adjusting circuit 30 for adjusting the bias current of the output amplifier 26.

A bias current adjusting circuit 301 shown in FIG. 7 is constructed by applying a current mirror circuit. The bias current adjusting circuit 301 has first, second and third MOS transistors $Q_1$, $Q_2$ and $Q_3$. One main electrode of the first MOS transistor $Q_1$ is connected to a power source Vdd through a resistor R serving as a constant current source, and the respective gate electrodes of the first to third MOS transistors $Q_1$, $Q_2$, $Q_3$ are commonly connected to one another. The middle point between the one main electrode of the first MOS transistor $Q_1$ and the resistor R is connected to the gate electrode of the MOS transistor $Q_1$, $Q_2$, $Q_3$. A first switching MOS transistor $Q_4$ is connected to the second MOS transistor $Q_2$ in series, and a second switching MOS transistor $Q_5$ is connected to the third MOS transistor $Q_3$ in series. The other main electrode of each of the first and second switching MOS transistors $Q_4$ and $Q_5$ and the other main electrode of the first MOS transistor $Q_1$, are grounded, and one main electrodes of the second and third MOS transistors $Q_2$ and $Q_3$ are commonly connected to each other and connected to a bias current output terminal $t_B$. In this embodiment, a selection signal $P_1$ from the timing generating circuit 27 is supplied to the gate electrode of the first switching MOS transistor $Q_4$, and a selection signal $P_2$ from the timing generating circuit 27 is supplied to the gate electrode of the second switching MOS transistor $Q_5$. The selection signals $P_1$, $P_2$ are formed of binary pulses having high level and low level, respectively.

The resistor R, the first MOS transistor $Q_3$ and the second MOS transistor $Q_2$, the first switching MOS transistor $Q_4$ constitute a current mirror circuit, and the resistor R, the first MOS transistor $Q_1$ and the third MOS transistor $Q_3$, the second switching MOS transistor $Q_5$ constitutes a current mirror circuit.

In the bias current adjusting circuit 301, current is determined by the resistor R, and the current value is returned by the current mirror circuit to be output as bias current to the terminal $t_B$. Here, four kinds of bias current containing current of zero can be output by selecting a proper combination of the gate widths of the second and third MOS transistors $Q_2$, $Q_3$.

For example, if the gate width of the second MOS transistor $Q_2$ is set to the same width as the first MOS transistor $Q_1$ and the gate width of the third MOS transistor $Q_3$ is set to twice the gate width of the first MOS transistor $Q_1$, one-unit bias current flows when the first switching MOS transistor $Q_4$ is switched on, and twice bias current flows when the first switching MOS transistor $Q_4$ is switched off and the second switching MOS transistor $Q_5$ is switched on. When both the switching MOS transistors $Q_4$, $Q_5$ are switched on, three-times bias current flows. Containing standby current (the state that both the switching MOS transistors $Q_4$, $Q_5$ are switched off: bias current of 0), the bias current can be changed to any one of four kinds of bias current.

There is a degree of freedom to determine the gate widths of the MOS transistors $Q_1$, $Q_2$, $Q_3$. With such a circuit construction, the bias current can be varied by properly inputting the selection signals $P_1$, $P_2$ from the timing generating circuit 27, and the bias current of the output amplifier 26 is switched.

In FIG. 7, if a circuit indicated by a broken line is added, the bias current can be varied to any one of eight kinds.

The current mirror circuit is also applied to the bias current adjusting circuit 302 shown in FIG. 8. The bias current adjusting circuit 302 has a first n-channel MOS transistor $Q_{11}$, a second n-channel MOS transistor $Q_{12}$, a first p-channel MOS transistor $Q_{13}$ serving as a constant current power source and a second p-channel MOS transistor $Q_{14}$. One main electrode of the first MOS transistor Q11 is connected to a power source Vdd through the first and second p-channel MOS transistors $Q_{13}$ and $Q_{14}$ connected in parallel, and the gate electrodes of the first and second MOS transistors $Q_{11}$, and $Q_{12}$ are commonly connected to each other. In addition, one main electrode of the first MOS transistor $Q_{11}$ and the connection middle point between the p-channel MOS transistors $Q_{13}$, $Q_{14}$ are connected to the gate electrodes of the MOS transistors $Q_{11}$, $Q_{12}$. The other main electrodes of the first and second MOS transistors $Q_{11}$, $Q_{12}$ are grounded, and one main electrode of the second MOS transistor $Q_{,12}$ is connected to the bias current output terminal $t_B$.

In this embodiment, the selection signal $P_1$ from the timing generating circuit 27 is supplied to the gate electrode of the first p-channel MOS transistor $Q_{13}$, and the selection signal $P_2$ from the timing generating circuit 27 is supplied to the gate electrode of the second MOS transistor $Q_{14}$. The selection signals $P_1$, $P_2$ are formed of binary pulses having high level and low level, respectively.

In the bias current adjusting circuit 302, the current is determined by the p-channel MOS transistors $Q_{13}$, $Q_{14}$ for which threshold values are properly adjusted, and the current value is returned by the current mirror circuit to be output to the terminal $t_B$ as bias current. Here, by setting the gate widths of the first and second p-channel MOS transistors $Q_{13}$, $Q_{14}$ to proper values, selectively inputting the two kinds of selection signals $P_1$, $P_2$ from the timing generating circuit 27 to the p-channel MOS transistors $Q_{13}$, $Q_{14}$ and controlling the current flowing in the p-channel MOS transistors $Q_{13}$, $Q_{14}$, the current to flow into the second MOS transistor $Q_{12}$ can be set to any one of four (2×2) kinds of current, and four kinds of bias current (containing current of zero) can be output.

According to the solid-state image pickup device 21 of this embodiment, on the basis of the external data corresponding to the driving mode of the sensor portion 22, not only the driving frequency is set, but also the bias current adjusting circuit 30 is controlled, that is, in the thin-out mode, the cut-out mode and the low-speed operating mode, the clock frequency of the driving scan pulse is reduced, the bias current output from the bias current adjusting circuit 30 is controlled in accordance with the reduction of the clock frequency to switch the bias current value of the output amplifier 26, and the f-characteristic value of the output amplifier 26 is switched to a low side, whereby the power consumption in the solid-state image pickup device 21 can be reduced. The random noise in the driving mode in which the clock frequency of the driving scan pulse is lowered can be reduced. Since the power consumption can be reduced, occurrence of heat flow can be suppressed, and dark current in the solid-state image pickup device can be reduced.

Particularly when the solid-state image pickup device 21 of this embodiment is applied to portable equipment or the like, the power consumption can be dramatically reduced, and the random noise in the driving mode in which the clock frequency is lowered can be reduced. Since the random noise can be reduced, image quality, so-called S/N ratio, dynamic range, etc. in the driving mode based on the low driving frequency such as the thin-out mode, the cut-out mode, the low-speed full-pixel reading mode or the like can be enhanced.

In the embodiment of FIG. 1, the frequency-dividing circuit 29 is installed in the solid-state image pickup device. However, the frequency of the input clock signal itself may be made variable without installing the frequency-dividing circuit 29 in the solid-state image pickup device. At this time, the bias current may be adjusted by input data independently of the input clock signal, or a circuit for controlling the bias current may be provided automatically interlockingly with the input clock signal. The bias current adjusting circuit 30 may be inseparable from the output amplifier 26 insofar as the action is the same.

Figure 2:
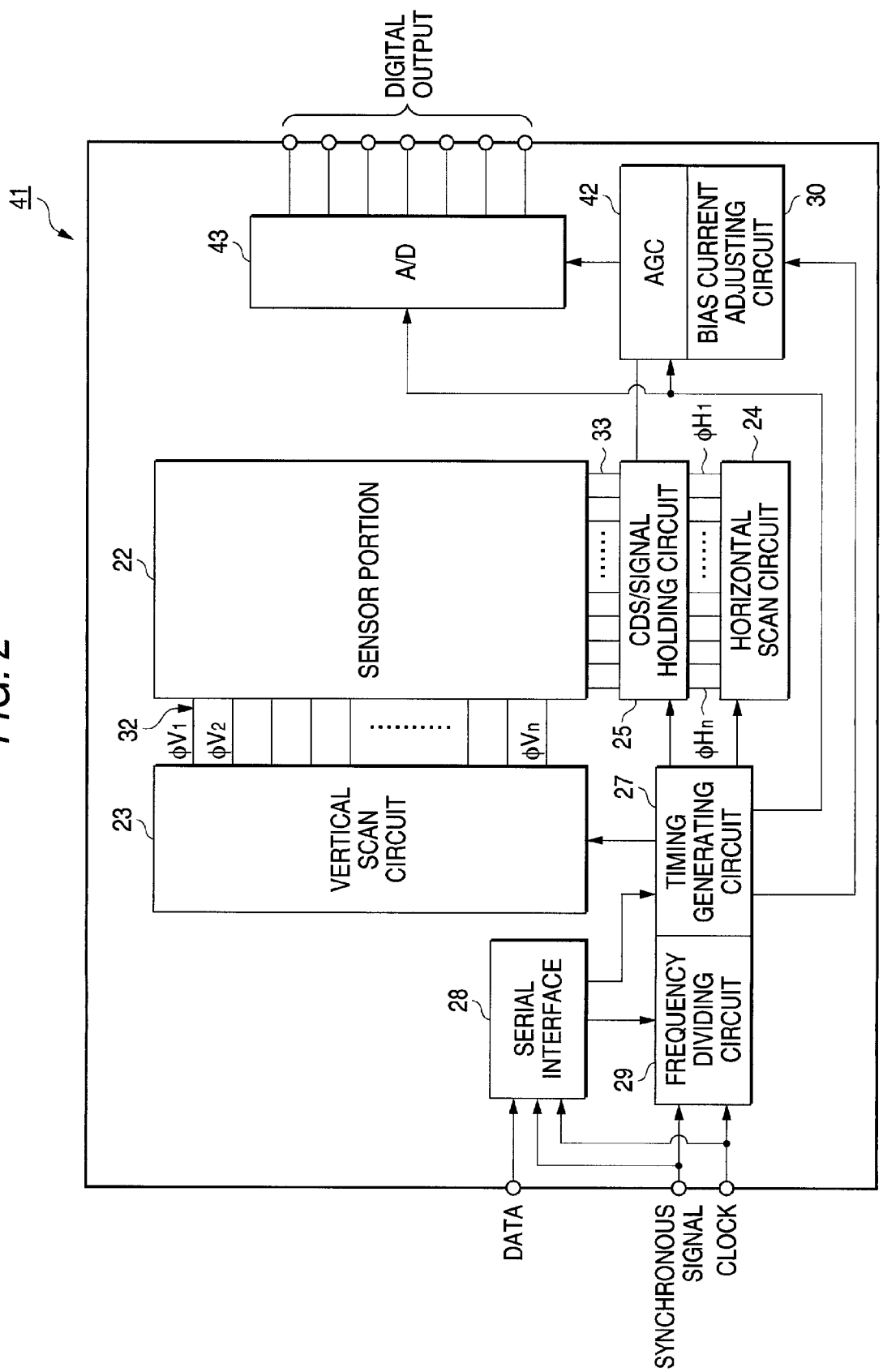
FIG. 2 is a diagram showing a second embodiment of the solid-state image pickup device according to the present invention.

FIG. 2 shows the overall construction of a second embodiment of the MOS type solid-state image pickup device according to the present invention.

In a solid-state image pickup device 41 according to this embodiment, the difference from the solid-state image pickup device 21 of the first embodiment of FIG. 1 resides in that an AGC (Auto Gain Control) circuit and an analog/digital (A/D) converter 43 are mounted to achieve a digital output. An AGC circuit 42 detects the signal level output from a CDS/signal holding circuit 25, amplifies the signal level at the proper gain corresponding to the signal level and then inputs the signal thus amplified to an A/D converter 43. The other construction is the same as shown in FIG. 1.

In this construction, since the power consumption in the AGC circuit 42 is increased, a bias current adjusting circuit 30 is equipped to the AGC circuit 42 to adjust the f-characteristic of the AGC circuit 42. The adjusting method is the same as described above. It is needless to say that the same method is applicable to the A/D converter 43.

That is, as in the case of the above-described embodiment, the solid-state image pickup device 41 of this embodiment includes a sensor portion 22 having many unit pixels arranged in a matrix form, each unit pixel comprising a photodiode for performing photoelectric conversion and an MOS switch element, a vertical scan circuit 23 and a horizontal scan circuit 24 for driving the sensor portion 22, a CDS/signal holding circuit 25 for receiving signals of pixels of one line of the sensor portion 22, a timing generating circuit 27 for generating pulses to operate the respective parts, a serial interface 28 and a frequency-dividing circuit 29 for frequency-dividing a clock signal in accordance with an instruction from the serial interface 28, and also includes an AGC circuit 42 and an A/D converter 43 which constitute the output portion in place of the output amplifier, and means for adjusting the f-characteristic of the AGC circuit 42 (in this embodiment, a bias current adjusting circuit 30 for adjusting the bias current for the AGC circuit 42, which is the same as described above).

In the sensor portion 22, each of vertical selecting lines 32 from the vertical scan circuit 23 is commonly connected to the pixels of each line to supply vertical scan pulses φV [φV$_1$, φV$_2$, . . . φV$_n$] from the vertical scan circuit 23 to the pixels of the respective lines through the vertical selection lines 32 at the same time. Further, each of vertical signal lines 33 is commonly connected to the pixels of each column, and each vertical signal line 33 is connected to a horizontal signal line 34 through the CDS/signal holding circuit 25. The horizontal signal line 34 is connected to the input side of the output amplifier 26. The CDS/signal holding circuit 25 is provided with horizontal switch elements in connection with the respective pixel columns, and horizontal scan pulses φH [φH$_1$, φH$_2$, . . . , φH$_n$] from the horizontal scan circuit 24 are supplied to the horizontal switch elements.

Serial data are input from the external to the serial interface 28. The serial data are input data to specify a driving mode for the sensor portion 22 as described later. A synchronous signal and a clock signal are input from the external to the serial interface 28 and the frequency-dividing circuit 29, respectively.

The timing generating circuit 27 is designed to generate timing pulses of plural driving modes in connection with plural driving modes. The timing generating circuit 27 supplies each of the vertical scan circuit 23, the horizontal scan circuit 24, the CDS/signal holding circuit 25, the AGC circuit 42, the bias current adjusting circuit 30 and the A/D converter 43 with pulses for driving the respective elements. The frequency-dividing circuit 29 frequency-divides the clock signal in accordance with an instruction from the serial interface 28, and inputs it to the timing generating circuit 27. The instruction of the serial interface 28 is input to the frequency-dividing circuit 29 and the timing generating circuit 27.

According to the MOS type solid-state image pickup device 41 of this embodiment, as in the case of the embodiment described with reference to FIG. 1, the input data based on the driving mode of the sensor portion 22 are input to the serial interface 28, and the clock signal which is frequency-divided in accordance with the driving mode in response to an instruction from the serial interface 28 is supplied from the timing generating circuit 27 to each element. Particularly in the driving mode in which the driving frequency is low, the bias current is switched by the bias current adjusting circuit 30 in the AGC circuit 42, whereby the f-characteristic is switched to the low side.

Accordingly, the power consumption of the output portion in which the highest power is consumed in the MOS type solid-state image pickup device 41 can be reduced as in the case of the above-described embodiment. Further, the random noise in the driving mode of the low driving frequency can be reduced. Since the random noise can be reduced, the image quality, so-called S/N ratio, dynamic range, etc. in the driving mode of the low driving frequency such as the thin-out mode, the cut-out mode, the low-speed full-pixel read-out mode or the like can be enhanced.

The output portion may be constructed by at least any one of the output amplifier, the AGC circuit and the A/D converter. Various pixel constructions may be adopted, and the driving pulse corresponding to the pixel circuit construction are supplied from the vertical scan circuit 23.

In the present invention, the MOS type solid-state image pickup device 21 or 41 may be installed in equipment, whereby it is constructed as a so-called image input device for a digital camera, a PC camera, an optical mouse, a portable TV telephone or the like.

According to the image input device, the power consumption can be greatly reduced, and the reduction of the random noise can be promoted. Accordingly, an image input device that is small in size, usable for a long time and has high image quality can be provided.

According to the solid-state image pickup device of the present invention, the bias current of the output portion is controlled in accordance with the driving mode and the frequency characteristic thereof is switched, that is, in the driving mode based on a low driving frequency such as the thin-out mode, the cut-out mode, the low-speed full-pixel reading mode or the like, the bias current of the output portion is controlled, and the frequency characteristic in the analog circuit of the output portion is switched to the low side, so that the power consumption of the solid-state image pickup device can be reduced. At the same time, the random noise in the driving mode in which the driving frequency is lowered can be reduced. Since the power consumption can be reduced, occurrence of heat flow can be suppressed, and the dark current of the solid-state image pickup device can be reduced.

Particularly in the image input system (image input device) using the solid-state image pickup device, the power consumption can be greatly reduced, and the random noise can be reduced. Since the random noise can be reduced, the image quality, for example, the S/N ratio, the dynamic range, etc. in the thin-out mode, the low-speed full-pixel reading mode or the like can be enhanced.

According to the image input device of the present invention, the power consumption can be greatly reduced, and the random noise can be reduced. Accordingly, there can be provided an image input device that is compact in size, usable for long time and has high image quality.

What is claimed is:

1. A solid-state image pickup device comprising:
   a sensor portion having plural pixels arranged;
   a vertical scan portion and a horizontal scan portion for scanning the pixels of said sensor portion;
   an output portion to which signals output from said sensor portion are supplied;
   a bias current adjusting portion for making the bias current of said output portion variable;
   a driving signal generator for supplying driving signals to said vertical scan portion, said horizontal scan portion and said output portion; and
   an input portion for supplying plural reading mode signals to said driving signal generator,
   wherein the driving frequency is made variable by the plural reading mode signals, and said bias current adjusting portion is supplied with a signal for making the bias current variable in accordance with the plural reading mode signals; and
   wherein said bias current adjusting portion reduces a frequency characteristic of said bias current of an amplifier when the plural reading mode signals effect low-speed operation of reduced frame readout mode.

2. The solid-state image pickup device as claimed in claim 1, wherein said output portion comprises at least any one of an output amplifier, an auto gain control circuit and an A/D converter, and the frequency characteristic of said output portion is switched among plural values in accordance with bias current from said bias current adjusting portion.

3. The solid-state image pickup device as claimed in claim 1, wherein said input portion has a frequency-dividing circuit for frequency-dividing the driving frequency by data input from the external, and a signal for switching the value of the frequency characteristic of said output portion is generated in accordance with the frequency-division based on the driving mode signal.

4. The solid-state image pickup device as claimed in claim 1, wherein the value of the frequency characteristic of said output portion is switched in accordance with the driving mode.

5. An image input device using a solid-state image pickup device comprising:
   a sensor portion having plural pixels arranged;
   a vertical scan portion and a horizontal scan portion for scanning the pixels of said sensor portion;
   an output portion to which signals output from said sensor portion are supplied;
   a bias current adjusting portion for making the bias current of said output portion variable;
   a driving signal generator for supplying driving signals to said vertical scan portion, said horizontal scan portion and said output portion; and
   an input portion for supplying plural reading mode signals to said driving signal generator,
   wherein the driving frequency is made variable by the plural driving mode signals,
   wherein said bias current adjusting portion is supplied with a signal for making the bias current variable in accordance with the plural reading mode signals, and
   wherein said bias current adjusting portion reduces a frequency characteristic of said bias current of an amplifier when the plural reading mode signals effect low-speed operation of reduced frame readout mode.

6. The image input device as claimed in claim 5, wherein said output portion comprises at least any one of an output amplifier, an auto gain control circuit and an A/D converter, and the frequency characteristic of said output portion is switched among plural values in accordance with bias current from said bias current adjusting portion.

7. The image input device as claimed in claim 5, wherein said input portion has a frequency-dividing circuit for frequency-dividing the driving frequency by data input from the external, and a signal for switching the value of the frequency characteristic of said output portion is generated in accordance with the frequency-division based on the driving mode signal.

8. The image input device as claimed in claim 5, wherein the value of the frequency characteristic of said output portion is switched in accordance with the driving mode.

9. A solid-state image pickup device comprising:
   a sensor portion having a plurality of pixels;
   a vertical scan portion and a horizontal scan portion for scanning the pixels of said sensor portion;
   a signal processing portion which is one of an amplifying portion and an analog-to-digital converting portion and is formed outside of said sensor portion;
   a bias current adjusting portion which makes a bias current of said signal processing portion variable;
   a driving signal generator which supplies driving signals to said vertical scan portion, said horizontal scan portion, and said signal processing portion; and
   an input portion which supplies plural reading mode signals to said driving signal generator,
   wherein a driving frequency is made variable by the plural driving mode signals,
   wherein said bias current adjusting portion is supplied with a signal for making the bias current variable in accordance with the plural reading mode signals, and wherein said bias current adjusting portion reduces a frequency characteristic of said bias current of an amplifier when the plural reading mode signals effect low-speed operation of reduced frame readout mode.

10. The solid-state image pickup device as claimed in claim 9, wherein signals from said sensor portion are selected by said horizontal scan portion and supplied to said signal processing portion through a horizontal signal line, and said signal processing portion is in an output area of said sensor portion.

11. The solid-state image pickup device as claimed in claim 1, wherein the plural reading signals effect a reading mode selected from the group consisting of full-pixel reading, thin-out reading, cut-out reading, and speed operating.

12. The image input device as claimed in claim 5, wherein the plural reading signals effect a reading mode selected from the group consisting of full-pixel reading, thin-out reading, cut-out reading, and speed operating.

13. The solid-state image pickup device as claimed in claim 9, wherein the plural reading signals effect a reading mode selected from the group consisting of full-pixel reading, thin-out reading, cut-out reading, and speed operating.

* * * * *